United States Patent
Hattori et al.

(10) Patent No.: US 8,257,060 B2
(45) Date of Patent: Sep. 4, 2012

(54) INVERTER-INTEGRATED ELECTRIC COMPRESSOR

(75) Inventors: Makoto Hattori, Aichi (JP); Koji Toyama, Aichi (JP); Takashi Nakagami, Aichi (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 454 days.

(21) Appl. No.: 12/443,320

(22) PCT Filed: Nov. 7, 2008

(86) PCT No.: PCT/JP2008/070289
§ 371 (c)(1),
(2), (4) Date: Mar. 27, 2009

(87) PCT Pub. No.: WO2009/084324
PCT Pub. Date: Jul. 9, 2009

(65) Prior Publication Data
US 2010/0183457 A1 Jul. 22, 2010

(30) Foreign Application Priority Data
Dec. 27, 2007 (JP) .................. 2007-337113

(51) Int. Cl.
*F04B 17/00* (2006.01)
(52) U.S. Cl. ..................... 417/410.1; 417/321
(58) Field of Classification Search .......... 417/366–368, 417/410.1, 321; 310/51–53, 66, 68 R
See application file for complete search history.

(56) References Cited

U.S. PATENT DOCUMENTS

| | | | |
|---|---|---|---|
| 2002/0025265 A1* | 2/2002 | Ikeda | 417/410.1 |
| 2003/0200761 A1* | 10/2003 | Funahashi et al. | 62/228.4 |
| 2007/0035272 A1* | 2/2007 | Hattori et al. | 318/823 |

FOREIGN PATENT DOCUMENTS

| | | |
|---|---|---|
| JP | 2001-211663 A | 8/2001 |
| JP | 2002-70743 A | 3/2002 |
| JP | 2003-153552 A | 5/2003 |
| JP | 2004-190525 A | 7/2004 |
| JP | 2006-29175 A | 2/2006 |
| JP | 2007-56724 A | 3/2007 |

OTHER PUBLICATIONS

International Search Report of PCT/JP2008/070289, date of mailing Dec. 16, 2008.

* cited by examiner

*Primary Examiner* — Bumsuk Won
(74) *Attorney, Agent, or Firm* — Westerman, Hattori, Daniels & Adrian, LLP

(57) ABSTRACT

Provided is a highly reliable inverter-integrated electric compressor that is capable of suppressing electromagnetic noise interference from a power-system metal board on which a semiconductor switching devices are bare-mounted and preventing malfunction of the inverter device. In an inverter-integrated electric compressor in which an inverter accommodating section provided on a housing accommodates an inverter device, the inverter device includes an inverter module in which a power-system metal board on which at least semiconductor switching devices are bare-mounted and a CPU board on which is mounted a control and communication circuit having a device operating at low voltage, such as a CPU, are modularized via a resin case, wherein the inverter module has a metal shield plate supported by the resin case and interposed between the power-system metal board and the CPU board.

7 Claims, 5 Drawing Sheets

INVERTER-INTEGRATED ELECTRIC COMPRESSOR

TECHNICAL FIELD

The present invention relates to an inverter-integrated electric compressor for a vehicle air-conditioner in which an inverter accommodating section is provided on the periphery of a housing accommodating an electric motor and a compressing mechanism, and an inverter device is accommodated in the interior thereof.

BACKGROUND ART

Recently, various inverter-integrated electric compressors constructed by integrating inverter devices have been proposed as compressors for vehicle air-conditioners mounted in vehicles. Such an inverter-integrated electric compressor for a vehicle air-conditioner is provided with an inverter accommodating section (inverter box) that is disposed on the periphery of a housing accommodating an electric motor and a compressing mechanism, and an inverter device that is accommodated in the interior thereof and that converts DC power supplied from a high-voltage power supply unit into three-phase AC power and supplies it to the electric motor via glass-sealed terminals. In this way, the rotational speed of the electric compressor can vary in response to the air conditioning load.

An example of such an inverter-integrated electric compressor is that described in, for example, Patent Document 1. An inverter device of this electric compressor includes a plurality of semiconductor power switching devices (IGBTs, etc.) that convert high-voltage DC power to three-phase AC power; a CPU board (printed board) on which a control and communication circuit, which is provided with a device operating at low voltage, such as a CPU, is mounted; high-voltage components, such as a head capacitor (smoothing capacitor) and an inductor coil, that are connected to a high-voltage line; a bus-bar assembly that constitutes the electrical wiring therebetween, and so on. These components are accommodated compactly in an inverter accommodating section (inverter box or outer frame).

Patent Document 1: Japanese Unexamined Patent Application, Publication No. 2004-190525

DISCLOSURE OF INVENTION

With the increasing density in the engine compartments of vehicles, there is a need for making compressors for vehicle air conditioners even more small and compact in order to ensure their mounting ability. Therefore, for an inverter-integrated electric compressor having an integrated inverter device, there is a strong need for reducing the size of the inverter accommodating section containing the inverter device. In order to satisfy such a need, modularization of inverter devices that integrate a power-system circuit board on which semiconductor switching devices are mounted and a CPU board (printed board) on which the control and communication circuit is mounted has been advancing as one way of making the inverter device and inverter accommodating section small and compact.

In such a case, since the semiconductor power switching devices have a configuration in which they are directly mounted on the bottom surface of the inverter accommodating section using packaged components, in many cases, a configuration in which they are bare-mounted on a metal board is employed. Thus, the inverter module is constructed by integrating this power-system metal board and the CPU board (CPU board) with a resin case, etc.

However, with such a configuration, electromagnetic noise caused by ripples and voltage surges is easily generated at the semiconductor switching devices (power devices) driven by a high-voltage power supply and bare-mounted on the power-system metal board. Such electromagnetic noise may cause electromagnetic noise interference when emitted to the low-voltage CPU board carrying out control and communication, entering the housing through communication lines, etc., and propagating through the control and communication circuit together with electromagnetic noise propagating from the power-system metal board to the power unit. Such electromagnetic noise interference may hinder normal operation of the inverter device and cause malfunctions.

The present invention has been conceived in light of the circumstances described above, and it is an object of the present invention to provide a highly reliable inverter-integrated electric compressor that is capable of suppressing electromagnetic noise interference from the power-system metal board on which the semiconductor switching devices are bare-mounted and preventing malfunction of the inverter device.

To solve the problems described above, the inverter-integrated electric compressor according to the present invention provides the following solutions.

Specifically, in an inverter-integrated electric compressor according to the present invention, an inverter accommodating section is provided on a periphery of a housing accommodating an electric motor and a compressing mechanism, and an inverter device that converts DC power supplied from a high-voltage power supply into three-phase AC power and supplies the three-phase AC power to the electric motor is accommodated inside thereof; the inverter device includes an inverter module in which a power-system metal board on which at least semiconductor switching devices are bare-mounted and a CPU board on which is mounted a control and communication circuit having a device operating at low voltage, such as a CPU, are modularized via a resin case; and the inverter module has a metal shield plate supported by the resin case and interposed between the power-system metal board and the CPU board.

According to the present invention, since the metal shield plate supported by the resin case is interposed between the power-system metal board on which the semiconductor switching devices of the inverter module are bare-mounted and the CPU board on which the control and communication circuit operating at low voltage is mounted, the metal shield plate can block electromagnetic noise generated at the semiconductor switching devices (power devices), which are driven by a high-voltage power supply and are bare-mounted on the power-system metal board, and emitted to the low-voltage CPU board carrying out control and communication. The electromagnetic noise entering the housing through a communication line, etc., propagating from the power-system metal board to the power unit, and further propagating to the low-voltage control and communication circuit on the CPU board can be deflected from the noise path by the metal shield plate. In this way, electromagnetic noise interference between the power-system metal board and the CPU board can be suppressed and malfunction of the control and communication circuit can be prevented so as to operate the inverter device normally, and product reliability can be improved.

In the above-described inverter-integrated electric compressor according to the present invention, the CPU board and the metal shield plate may be frame-grounded to the housing via ground lines and the power-system metal board.

According to this configuration, since the metal shield plate, together with the CPU board, is frame-grounded to the housing via the ground lines and the power-system metal board, the shielding effect of electromagnetic noise and the grounding effect provided by the metal shield plate can be increased. In this way, electromagnetic noise interference can be suppressed, and malfunction of the inverter device can be prevented.

In the above-described inverter-integrated electric compressor according to the present invention, an extended section that is embedded in the resin case, that is extended to the bottom section thereof, and that is frame-grounded to the motor housing may be integrally provided at an end of the metal shield plate supported by the resin case.

According to this configuration, since the extended section that is embedded in the resin case, that is extended to the bottom section thereof, and that is frame-grounded to the motor housing is integrally provided at an end of the metal shield plate supported by the resin case, the shielding effect of electromagnetic noise and the grounding effect provided by the metal shield plate can be improved even more. In this way, electromagnetic noise interference can be suppressed, and malfunction of the inverter device can be reliably prevented. Furthermore, since the rigidity and the strength of the resin case can be increased by using the extended section embedded in the resin case as a reinforcement member, the vibration resistance of the inverter module can be increased.

In the above-described inverter-integrated electric compressor according to the present invention, the extended section may embedded in the resin case, may be bent and extended to a mounting leg on the bottom section of the resin case, and may be frame-grounded to the housing via a screw for fixing the resin case.

According to this configuration, since the extended section integrated with the metal shield plate is bent and extended to the mounting leg on the bottom section of the resin case and is frame-grounded to the housing via the screw for fixing the resin case, the grounding effect of the metal shield plate provided for the housing can be increased. In this way, the shielding effect of electromagnetic noise and the grounding effect provided by the metal shield plate can be improved even more.

In any one of the above-described inverter-integrated electric compressors according to the present invention, the metal shield plate may be constructed of a heat-conducting and electricity-conducting material, such as a copper plate, an aluminum plate, or an iron plate.

According to this configuration, since the metal shield plate is constructed of a heat-conducting and electricity-conducting material, such as a copper plate, an aluminum plate, or an iron plate, electromagnetic noise emitted to the CPU board can be blocked, and, at the same time, grounding and heat transfer to the housing is enabled via the copper plate, the aluminum plate, or the iron plate, having good heat-conductivity and electricity-conductivity. In this way, electromagnetic noise interference can be suppressed, and malfunction of the inverter device can be reliably prevented.

In any one of the above-described inverter-integrated electric compressors according to the present invention, insulating resin may be filled inside the resin case to a position at least covering the upper surface of the power-system metal board.

According to this configuration, since the insulating resin is filled inside the resin case to a position at least covering the upper surface of the power-system metal board, the insulating ability of the power-system metal board on which the semiconductor switching devices are bare-mounted is maintained by the insulating resin, thus preventing vibration and moisture in the power-system metal board. In this way, the reliability of the operation and the performance of the power-system metal board on which the semiconductor switching devices are bare-mounted can be improved.

In the above-described inverter-integrated electric compressor according to the present invention, the insulating resin may be filled to a position covering upper surface of the metal shield plate.

According to this configuration, since the insulating resin is filled to a position covering the upper surface of the metal shield plate, the insulating resin can be cooled via the frame-grounded metal shield plate. In this way, the effect of cooling the semiconductor switching devices, which are are-mounted via the insulating resin, can be increased, and the heat resistance ability can be improved even more.

In any one of the above-described inverter-integrated electric compressors according to the present invention, the bottom surface of the power-system metal board may constitute a heat sink section and may be disposed in contact with the outer surface of the housing on which the inverter accommodating section is provided.

According to this configuration, since the bottom surface of the power-system metal board constitutes the heat sink section and is disposed in contact with the outer surface of the housing on which the inverter accommodating section is provided, the entire power-system metal board on which the semiconductor switching devices are mounted can be force-cooled via the housing wall by a refrigerant circulating therein. In this way, a cooling path of the semiconductor switching devices, which are highly heat-generating components, can be established, and the heat resistance reliability of the inverter module can be ensured.

According to the present invention, since the metal shield plate can block electromagnetic noise generated at the semiconductor switching devices (power devices), which are driven by a high-voltage power supply and bare-mounted on the power-system metal board, and emitted to the low-voltage CPU board carrying out control and communication, and since the electromagnetic noise entering the housing through a communication line, etc., propagating from the power-system metal board to the power unit, and possibly further propagating to the low-voltage control and communication circuit on the CPU board, can be deflected from the noise path by the metal shield plate, the electromagnetic noise interference between the power-system metal board and the CPU board can be suppressed, and malfunction of the control and communication circuit can be prevented so as to operate the inverter device normally. Consequently, product reliability can be improved.

EXPLANATION OF REFERENCE SIGNS

Figure 1:
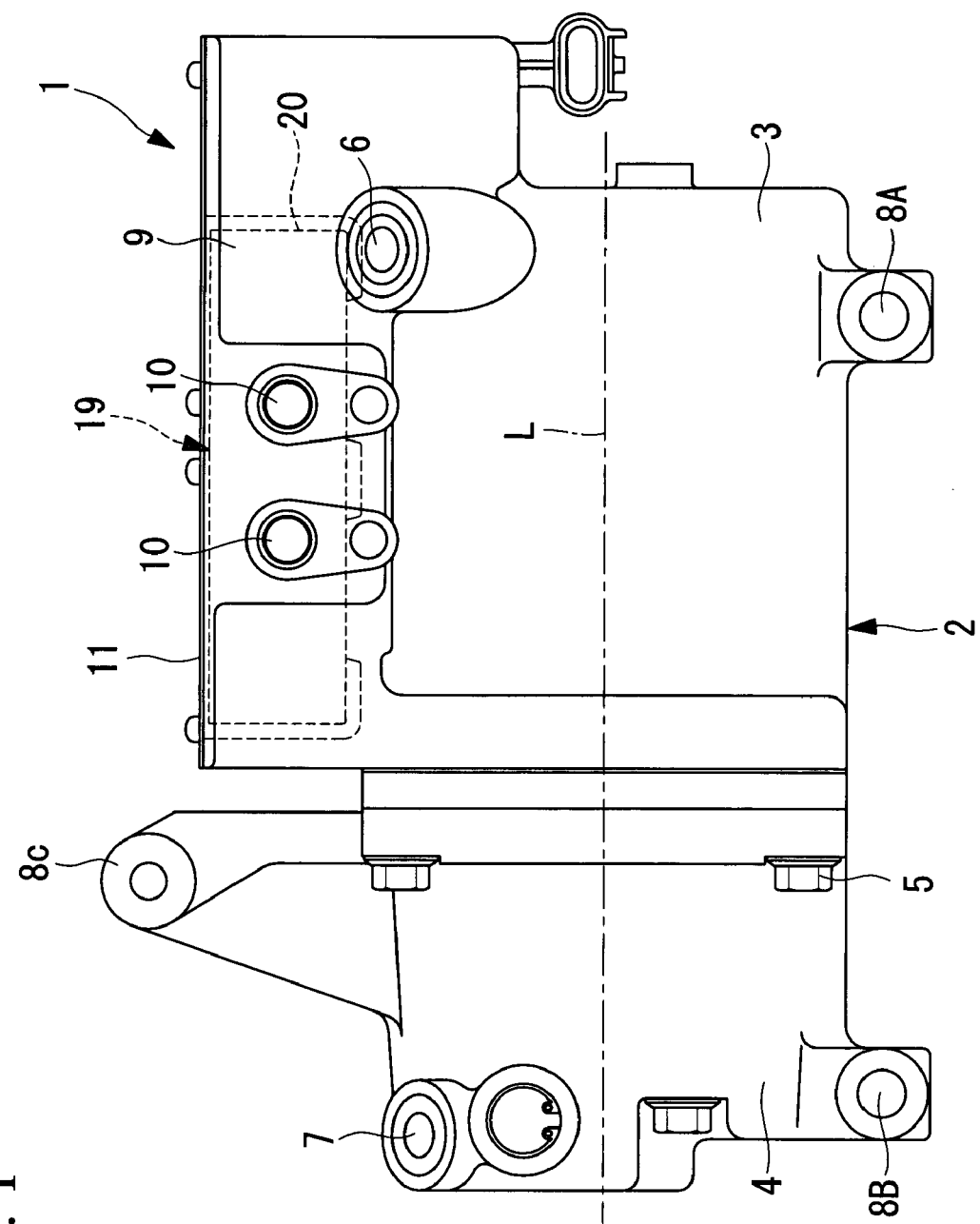
FIG. 1 is an external side view of an inverter-integrated electric compressor according to a first embodiment of the present invention.
Figure 2A:
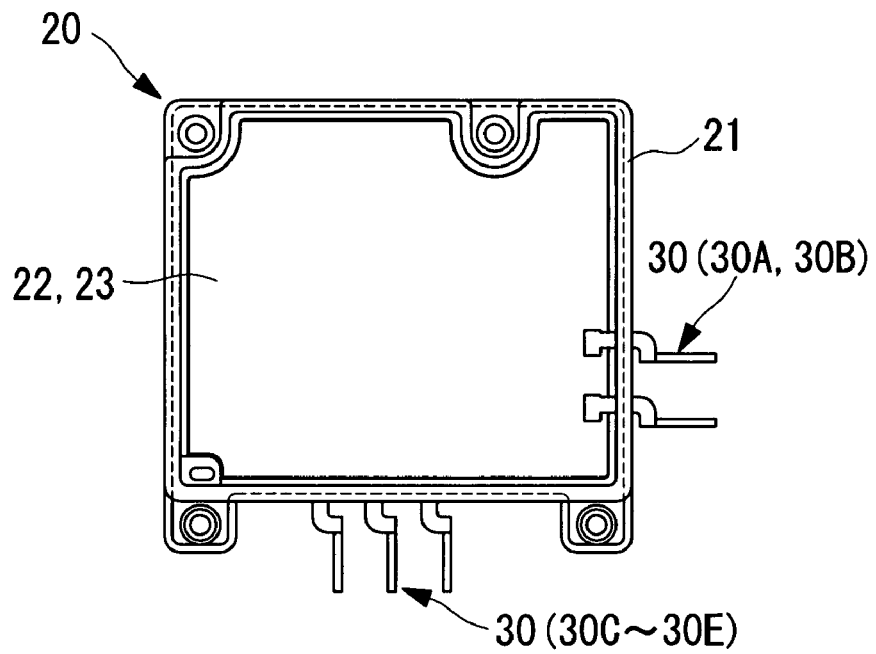
FIG. 2A is a plan view of an inverter module constituting an inverter device of the inverter-integrated electric compressor shown in FIG. 1.
Figure 2B:
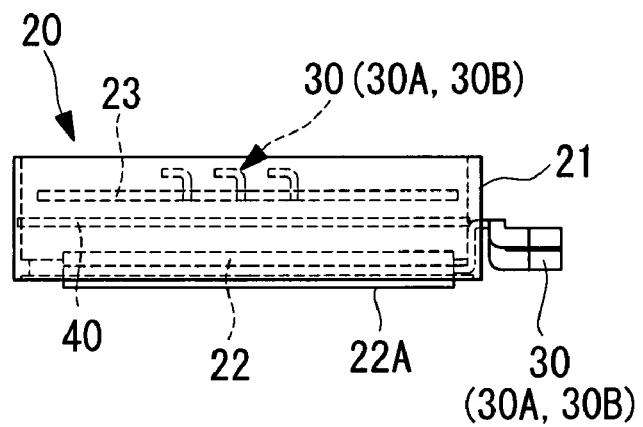
FIG. 2B is a lower side view of the inverter module constituting the inverter device of the inverter-integrated electric compressor shown in FIG. 1.
Figure 2C:
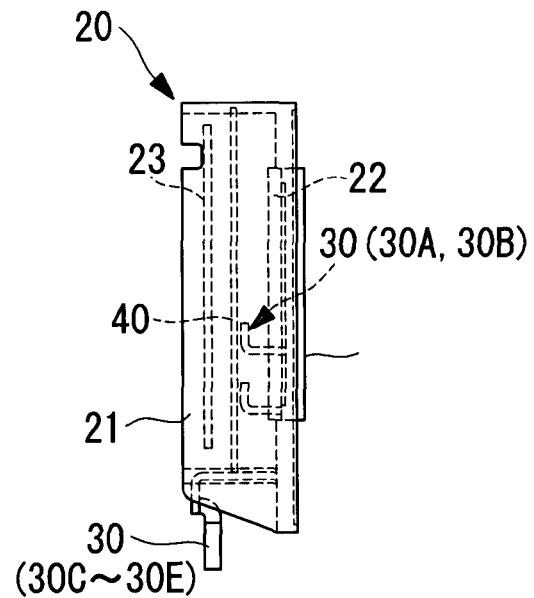
FIG. 2C is a left side view of the inverter module constituting the inverter device of the inverter-integrated electric compressor shown in FIG. 1.
Figure 2D:
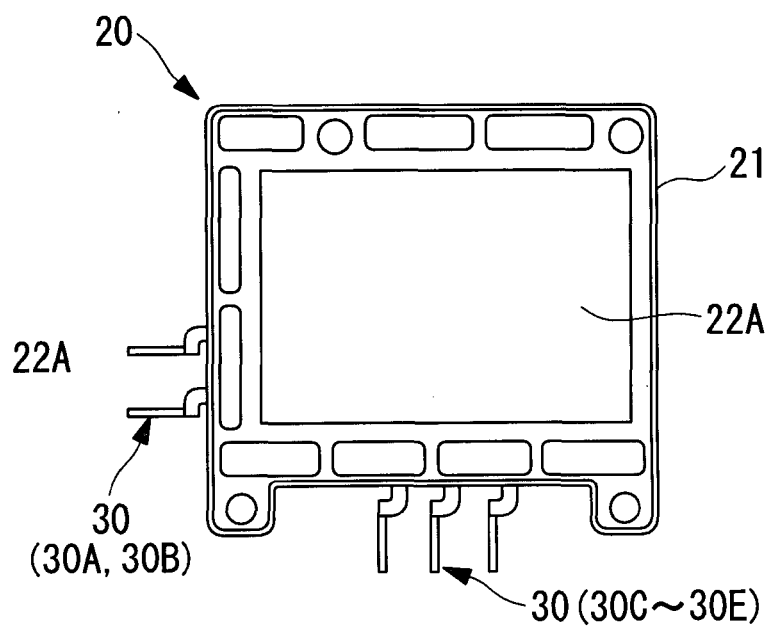
FIG. 2D is a bottom view of the inverter module constituting the inverter device of the inverter-integrated electric compressor shown in FIG. 1.

1: inverter-integrated electric compressor
2: housing
9: inverter accommodating section
19: inverter device
20: inverter module
21: resin case
21A: mounting leg
22: power-system metal board
22A: heat sink section
23: CPU board
25: semiconductor switching device (bare chip)
40: metal shield plate
40A: extended section
40B: bent section
41: ground line (FG line)
42: insulating resin

BEST MODE FOR CARRYING OUT THE INVENTION

Embodiments of the present invention will be described below with reference to the drawings.

First Embodiment

A first embodiment of the present invention will be described with reference to FIGS. 1 to 3.

FIG. 1 is an external side view of an inverter-integrated electric compressor according to the first embodiment of the present invention. An inverter-integrated electric compressor 1 includes a housing 2 that forms the outer shell thereof. The housing 2 is constructed by integrating, by tightly fastening with bolts 5, a motor housing 3 for accommodating an electric motor 9 and a compressor housing 4 for accommodating a compressing mechanism (not shown). The motor housing 3 and the compressor housing 4 are pressure-resistant containers and are formed of aluminum alloy by aluminum die-casting.

The electric motor and the compressing mechanism, which is not shown in the drawing, accommodated inside the housing 2 are linked via a motor shaft, and the compressing mechanism is configured to be driven by rotation of the electric motor. A refrigerant suction port 6 is provided at one end (on the right side in FIG. 1) of the motor housing 3, and low-temperature, low-pressure refrigerant gas taken in from this refrigerant suction port 6 into the motor housing 3 flows around the electric motor in the motor axis L direction and is then taken into the compressing mechanism, where it is compressed. High-temperature, high-pressure refrigerant gas compressed by the compressing mechanism is released into the compressor housing 4 and is then expelled to the outside via a discharge port 7 provided at one end (on the left side in FIG. 1) of the compressor housing 4.

The housing 2 has mounting legs 8A, 8B, and 8C at a total of three positions: for example, two at a lower part at one end (on the right side in FIG. 1) of the motor housing 3 and a lower part at one end (on the left side in FIG. 1) of the compressor housing 4, and one at an upper part of the compressor housing 4. The inverter-integrated electric compressor 1 is mounted by securing these mounting legs 8A, 8B, and 8C to a side wall, etc. of a driving motor, which is provided inside the engine compartment of the vehicle, with a bracket and bolts. The inverter-integrated electric compressor 1 is usually cantilevered at three points on the upper and lower sides with a securing bracket such that the motor axis L direction is in the front-to-back direction or the left-to-right direction of the vehicle.

A box-shaped inverter accommodating section 9 is integrated with the periphery of the motor housing 3 at the upper section thereof. The inverter accommodating section 9 is shaped like a box that is open at the top and surrounded by a peripheral wall having a predetermined height. Two cable lead-out ports 10 are provided on the side surfaces thereof. The upper surface of the inverter accommodating section 9 is closed with a cover member 11 fixed with screws. A three-phase inverter device 19 that converts DC power supplied from a high-voltage power supply unit via high-voltage cables into three-phase AC power and supplies this three-phase AC power to the electric motor is accommodated inside the inverter accommodating section 9.

In addition to an inverter module 20 that forms the core of the inverter device 19, the inverter device 19 is constructed of electrical components, such as P-N terminals connected to the high-voltage cables (not shown); high-voltage components, such as a head capacitor and an inductor coil, connected to high-voltage power supply lines; a bus-bar assembly including a plurality of integrated bus bars, which constitute the electrical wiring among the P-N terminals and the high-voltage components inside the inverter device 19, and the inverter module 20, and being composed of insert-molded insulating resin; and glass-sealed terminals that supply three-phase AC power converted at the inverter device 20 to the electric motor.

As shown in FIGS. 2A to 2D, the inverter module 20 has a box-shaped resin case 21 accommodated in the inverter accommodating section 9 and is modularized by providing a power-system metal board 22 and a CPU board (printed board) 23, which constitute the inverter device 19 inside the resin case 21. On the power-system metal board 22, a plurality of semiconductor switching devices 25 formed of IGBTs, etc. (see FIG. 3) are bare-mounted (bare chip). On the CPU board 23, a control and communication circuit having devices operating at low-voltage, such as a CPU and so on, is mounted.

The bottom surface of the power-system metal board 22 on which the semiconductor switching devices 25 are mounted is exposed at the bottom section of the resin case 21 and constitutes a heat sink section 22A for cooling the semiconductor switching devices 25 and so on, which are heat generating components. This heat sink section 22A is disposed in contact with the housing wall of the motor housing 3 constituting the bottom surface of the inverter accommodating section 9 and is cooled by the coldness of the low-temperature refrigerant gas circulating inside the motor housing 3 so as to constitute a cooling path of the heat generating components, such as the semiconductor switching devices 25 mounted on the power-system metal board 22.

Terminals 30 that electrically connect the power-system metal board 22, the high-voltage lines, and the electric motor are integrally insert-molded with the resin case 21. The terminals 30 include two terminals 30A and 30B for the high-voltage lines provided on one side of the resin case 21 and three U-V-W terminals 30C, 30D, and 30E for the electric motor provided on another side surface of the resin case 21. The terminals 30A to 30E are formed by bending brass plates. On one end of each of the terminals 30A to 30E, a welded surface plated with tin or the like to be connected to the circuits on the power-system metal board 22 via a bonding wire is provided. On the other end, a welded surface plated with nickel or the like to be connected to a terminal or bus-bar connected to the electric motor and the high-voltage lines is provided. Each of the terminals 30A to 30E is welded and plated with a material suitable for the material of the other member.

Figure 3:
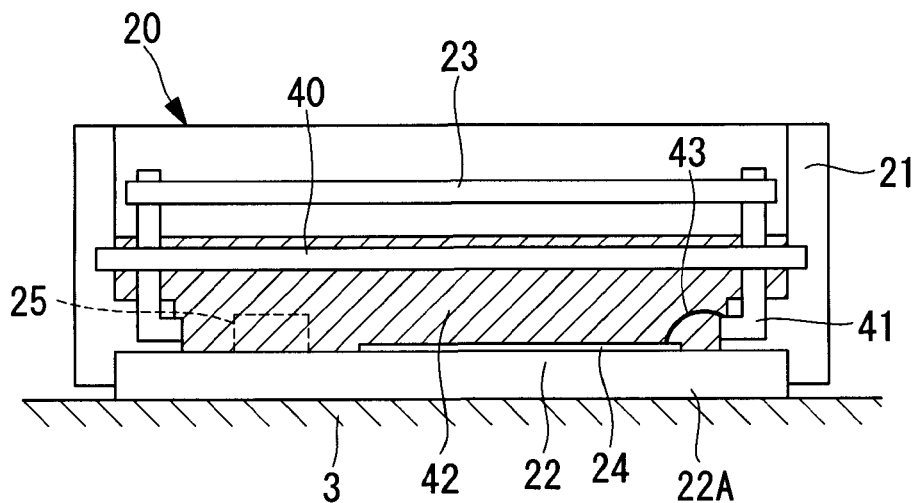
FIG. 3 is a longitudinal sectional view of the inverter module shown in FIGS. 2A to 2D.

Furthermore, as shown in FIG. 3, in the resin case 21, a metal shield plate 40 is interposed between the power-system metal board 22 and the CPU board 23 so as to block electromagnetic noise that is generated when the semiconductor switching devices 25, etc. bare-mounted on the power-system metal board 22 are driven by high-voltage power and that is emitted to the low-voltage CPU board 23, as well as electromagnetic noise that enters the housing through communication lines, etc. and that is propagated from the power-system metal board 22 to the power section and further to the low-voltage control and communication circuit on the CPU board 23. The metal shield plate 40 is constructed of a heat-conducting and electricity-conducting material, such as a copper plate, an aluminum plate, or an iron plate, and covers the upper surface of the power metal board 22 with the ends thereof inserted into the resin case 21.

Together with the CPU board 23, the metal shield plate 40 is connected to a land of a copper-foil pattern 24 connected on the power-system metal board 22 via a ground line (FG line) 41 and a wire bonder 43 that is connected to the lower edge thereof and is frame-grounded to the motor housing 3 via the power-system metal board 22. Part of the ground line (FG line) 41 is integrally injection molded such that part of it is embedded in the resin case 21. The interior of the resin case 21 where the power-system metal board 22, the CPU board 23, and the metal shield plate 40 are provided is filled with insulating resin 42, such as epoxy resin, to a position covering the upper surface of the metal shield plate 40. The insulating resin 42 does not necessarily have to be filled to a position covering the upper surface of the metal shield plate 40 so long as it is filled to at least a position covering the upper section of the power-system metal board 22.

The resin case 21 is fixed to the bottom surface of the inverter accommodating section 9 with screws that are not shown in the drawings.

According to this embodiment with the above-described configuration, the following advantages are achieved.

DC power supplied from a high-voltage power supply unit mounted in the vehicle to the P-N terminals of the inverter device 19 of the electric compressor 1 via the high-voltage cables is regulated by the high-voltage components, such as the head capacitor and the inductor coil, and input to the inverter module 20 via the terminals 30A and 30B. This DC power is converted into three-phase AC power having a control command frequency instructed by a higher-level control device (not shown) by the switching operation of the plurality of semiconductor switching devices 25 mounted on the power-system metal board 22 of the inverter module 20 and is then supplied from the U-V-W terminals 30C, 30D, and 30E to the electric motor inside the motor housing 3 via the glass-sealed terminals.

In this way, the electric motor is rotationally driven at the control command frequency, and the compression mechanism is operated. By operating the compression mechanism, low-temperature, low-pressure refrigerant gas is taken into the motor housing 3 through the refrigerant suction port 6. This refrigerant flows around the electric motor to the compressor housing 4 in the motor axis L direction, is taken into the compression mechanism, is compressed to a high-temperature, high-pressure state, and is then discharged into the compressor housing 4. The high-temperature, high-pressure refrigerant is discharged outside the electric compressor 1 from the discharge port 7. During this period, the low-temperature, low-pressure refrigerant taken in from the refrigerant suction port 6 to the motor housing 3 and flowing in the motor axis L direction cools the heat sink section 22A disposed in contact with a wall of the motor housing 3, via the housing walls of the motor housing 3, and cools the power-system metal board 22. In this way, heat-generating components, such as the semiconductor switching devices 25, mounted on the power-system metal board 22 are force-cooled, and their heat resistance performance is maintained.

At the same time, when high-voltage DC power is supplied to the power-system metal board 22 and switching operation of the semiconductor switching devices 25 is carried out, electromagnetic noise is generated. This electromagnetic noise generated at the power-system metal board 22 is emitted to the low-voltage control and communication circuit on the CPU board 23 but can be blocked by the metal shield plate 40 since the metal shield plate 40 is provided between the power-system metal board 22 and the CPU board 23.

The electromagnetic noise entering the housing from an external control device via communication lines propagates and radiates to signal lines, etc. from the connected boards to the power section or propagates from the power-system metal board 22 to the power section and may further propagate to and irradiate the low-voltage control and communication circuit on the CPU board 23. Such electromagnetic noise can also be deflected from the noise path by the metal shield plate (copper plate) 40 provided between the power-system metal board 22 and the CPU board 23.

Therefore, electromagnetic noise interference caused by noise propagating and radiating to the signal system or electromagnetic noise from the high-voltage system propagating and radiating to the control and communication circuit on the CPU board 23 can be suppressed, and thus malfunction, of the control and communication circuit caused thereby can be prevented. Consequently, the inverter device 19 can be operated normally, and product reliability can be improved.

Since the metal shield plate (copper plate) 40 is frame-grounded, together with the CPU board 23, to the motor housing 3 via the ground line 41, the wire bonder 43, and the power-system metal board 22, the shielding effect of electromagnetic noise and the grounding effect provided by the metal shield plate 40 can be increased. Therefore, malfunction of the inverter device 19 due to electromagnetic noise interference can be reliably prevented, and the reliability can be increased.

In this embodiment, since the insulating resin 42 is filled inside the resin case 21 to a position covering the upper surface of the metal shield plate 40, the insulating ability of the power-system metal board 22 on which the semiconductor switching devices 25 are mounted is maintained by the insulating resin 42, thus preventing vibration and moisture in the power-system metal board 22. Therefore, the reliability of the operation and the performance of the power-system metal board 22 on which the semiconductor switching devices 25 are bare-mounted can be improved. At the same time, since the insulating resin 42 can be cooled via the frame-grounded metal shield plate 40, and the semiconductor switching devices 25 can be cooled via the insulating resin 42, the cooling effect of the semiconductor switching devices 25 is increased, and the heat resistance ability can be improved even more.

Furthermore, since the bottom surface of the power-system metal board 22 on which the semiconductor switching devices 25 are mounted forms the heat sink section 22A, and since it is disposed in contact with the outer surface of the motor housing 3 on which the inverter accommodating section 9 is provided, the entire power-system metal board 22 on which the semiconductor switching devices 25 are mounted can be force-cooled via the wall of the motor housing 3 by the refrigerant circulating therein. In this way, a cooling path of the semiconductor switching devices 25, which are highly heat-generating components, can be established, and the heat resistance reliability of the inverter module can be ensured.

Second Embodiment

Figure 4:
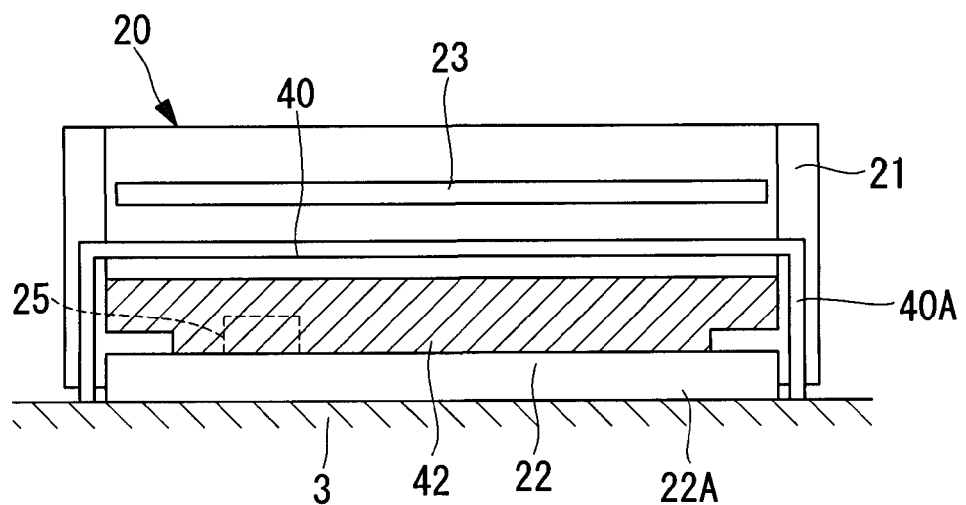
FIG. 4 is a longitudinal sectional view of an inverter module constituting an inverter device of an inverter-integrated electric compressor according to a second embodiment of the present invention.

Next, a second embodiment of the present invention will be described with reference to FIG. 4.

This embodiment differs from the above-described first embodiment in the structure of the metal shield plate 40 and the configuration of the frame-grounding. Since other aspects are the same as those in the first embodiment, descriptions thereof will be omitted.

This embodiment has a configuration in which an extended section 40A is integrated with the ends of the metal shield plate (copper plate) 40 inserted into the resin case 21, and the extended section 40A is embedded in the resin case 21, extends to the bottom section thereof, and is frame-grounded to the motor housing 3.

As described above, by integrating the extended section 40A, which is embedded in the resin case 21 and extends to the bottom section thereof to be frame-grounded to the motor housing 3, with the end of the metal shield plate 40 supported by the resin case 21, the shielding effect of electromagnetic noise and the grounding effect provided by the metal shield plate 40 can be improved even more. Consequently, electromagnetic noise interference between the power-system metal board 22 and the CPU board 23 can be suppressed, and malfunction of the inverter device 19 can be reliably prevented. Since the extended section 40A embedded in the resin case 21 functions as a reinforcement member to increase the rigidity and the strength of the resin case 21, the vibration resistance of the inverter module 20 can be increased.

In this embodiment, the insulating resin 42 is filled to a position covering the upper surface of the power-system metal board 22, and the metal shield plate 40 is exposed at the upper surface of the insulating resin 42. Even with this configuration, the insulation, vibration resistance, and moisture resistance functions provided for the power-system metal board 22 are not hindered, and there are no problems in particular.

Third Embodiment

Figure 5:
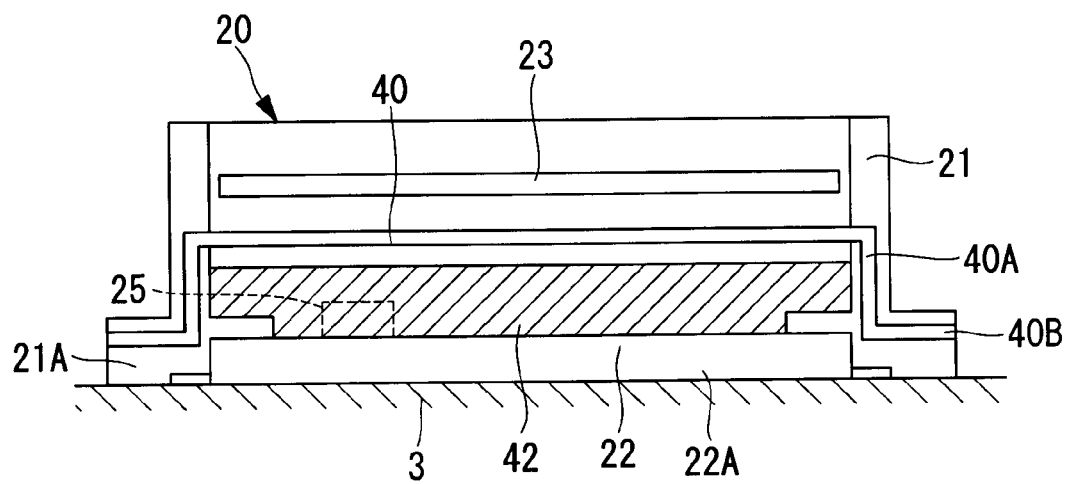
FIG. 5 is a longitudinal sectional view of an inverter module constituting an inverter device of an inverter-integrated electric compressor according to a third embodiment of the present invention.

Next, a third embodiment of the present invention will be described with reference to FIG. 5.

This embodiment differs from the above-described first and second embodiments in the configuration of the frame-grounding of the metal shield plate 40. Since other aspects are the same as those in the first and second embodiments, descriptions thereof will be omitted.

This embodiment has a configuration in which a bent section 40B that is embedded in the resin case 21 and extends to a mounting leg 21A at the bottom section of the resin case 21 is provided on the extended section 40A of the metal shield plate 40, and the bent section 40B is frame-grounded to the motor housing 3 via screws (not shown) for fixing the resin case 21.

In this way, since the bent section 40B is provided on the extended section 40A integrated with the metal shield plate 40, and since the bent section 40B extends to the mounting leg 21A of the resin case 21 and is frame-grounded to the motor housing 3 via screws for fixing the resin case 21, the grounding effect of the metal shield plate 40 provided for the motor housing 3 can be increased even more. Therefore, the shielding effect of electromagnetic noise and the grounding effect provided by the metal shield plate 40 can be improved even more.

The present invention is not limited to the embodiments described above, and various modifications may be made so long as they do not depart from the spirit of the invention. For example, in the above-described embodiments, examples in which the inverter accommodating section 9 and the motor housing 3 are integrated are described. However, they do not necessarily have to be integrated, and instead, a separate inverter accommodating section may be assembled to form a single unit. Moreover, the compression mechanism is not particularly limited, and any type of compression mechanism may be employed. Furthermore, the metal shield plate 40 does not necessarily have to be formed of a thick plate having rigidity, and instead may be formed of a thin sheet or foil. The metal shield plate according to the present invention includes such a sheet or foil.

The invention claimed is:

1. An inverter-integrated electric compressor in which an inverter accommodating section is provided on a periphery of a housing accommodating an electric motor and a compressing mechanism, and an inverter device that converts DC power supplied from a high-voltage power supply into three-phase AC power and supplies the three-phase AC power to the electric motor is accommodated inside thereof,
    wherein the inverter device includes an inverter module in which a power-system metal board on which at least semiconductor switching devices are bare-mounted and a CPU board on which is mounted a control and communication circuit having a device operating at low voltage, are modularized via a resin case,
    wherein the inverter module has a metal shield plate supported by the resin case and interposed between the power-system metal board and the CPU board,
    wherein the bottom surface of the power-system metal board constitutes a heat sink section in the resin case and is disposed in contact with the outer surface of the housing on which the inverter accommodating section is provided.

2. The inverter-integrated electric compressor according to claim 1, wherein the CPU board and the metal shield plate are frame-grounded to the housing via ground lines and the power-system metal board.

3. The inverter-integrated electric compressor according to claim 1, wherein an extended section that is embedded in the resin case, that is extended to the bottom section thereof, and that is frame-grounded to the housing is integrally provided at an end of the metal shield plate supported by the resin case.

4. The inverter-integrated electric compressor according to claim 3, wherein the extended section is embedded in the resin case, is bent and extended to a mounting leg on the bottom section of the resin case, and is frame-grounded to the housing via a screw for fixing the resin case.

5. The inverter-integrated electric compressor according to claim 1, wherein the metal shield plate is constructed of a heat-conducting and electricity-conducting material.

6. The inverter-integrated electric compressor according to claim 1, wherein insulating resin is filled inside the resin case to a position at least covering the upper surface of the power-system metal board.

7. The inverter-integrated electric compressor according to claim 6, wherein the insulating resin is filled to a position covering upper surface of the metal shield plate.

* * * * *